US006139761A

United States Patent [19]

Ohkuma

[11] Patent Number: 6,139,761

[45] Date of Patent: *Oct. 31, 2000

[54] MANUFACTURING METHOD OF INK JET HEAD

[75] Inventor: Norio Ohkuma, Yokohama, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/670,581

[22] Filed: Jun. 26, 1996

[30] Foreign Application Priority Data

Jun. 30, 1995 [JP] Japan .................................... 7-165799

[51] Int. Cl.[7] .................................................. H01L 21/306

[52] U.S. Cl. ............................................................ 216/27

[58] Field of Search ................................................ 216/27

[56] References Cited

U.S. PATENT DOCUMENTS

| | | | |
|---|---|---|---|
| 4,789,425 | 12/1988 | Drake et al. | 156/644 |
| 4,863,560 | 9/1989 | Hawkins | 156/644 |
| 4,961,821 | 10/1990 | Drake et al. | 156/647 |
| 4,985,710 | 1/1991 | Drake et al. | 346/1.1 |
| 5,277,755 | 1/1994 | O'Neill | 156/647 |
| 5,308,442 | 5/1994 | Taub et al. | 156/644 |
| 5,383,635 | 1/1995 | Barone | 248/188.1 |

FOREIGN PATENT DOCUMENTS

| | | |
|---|---|---|
| 0 609 011 | 8/1994 | European Pat. Off. . |
| 0609860 | 8/1994 | European Pat. Off. . |
| 62-264957 | 11/1987 | Japan . |
| 4-10941 | 1/1992 | Japan . |
| 4-10942 | 1/1992 | Japan . |
| 5-131628 | 5/1993 | Japan . |

*Primary Examiner*—Gary L. Kunz
*Assistant Examiner*—Everett White
*Attorney, Agent, or Firm*—Fitzpatrick, Cella, Harper & Scinto

[57] ABSTRACT

A manufacturing method for an ink jet head having an ink ejection pressure generation element for generating energy for ejecting ink, and an ink supply port for supplying the ink to an ink jet head, including the steps of preparing a silicon substrate; forming, on a surface of the silicon substrate, the ink ejection pressure generation element and silicon oxide film or silicon nitride film; forming anti-etching mask for forming an ink supply port on a back side of the silicon substrate; removing silicon on the back side of the silicon substrate at a position corresponding to the ink supply port portion through anisotropic etching; forming an ink ejection portion on a surface of the silicon substrate; and removing the silicon oxide film or silicon nitride film from the surface of the silicon substrate of the ink supply port portion.

18 Claims, 5 Drawing Sheets

MANUFACTURING METHOD OF INK JET HEAD

FIELD OF THE INVENTION AND RELATED ART

The present invention relates to a manufacturing method for ink jet heads for generating a recording liquid droplet usable with an ink jet type apparatus. More particularly, the present invention relates to a manufacturing method for an ink jet head of the so-called side shooter type which ejects the recording liquid droplet in a direction substantially perpendicular to the surface having an ink ejection pressure generation element.

In the so-called side shooter type ink jet head, wherein the ink is ejected upwardly from the ink ejection pressure generation element, a substrate having an ink ejection pressure generation element (ejection energy generating element) is provided with a through-opening (ink supply port) to supply the ink from the back side (not having the ink ejection pressure generation element) of the substrate, as disclosed in Japanese Laid Open Patent Application No. SHO-62-264957 or U.S. Pat. No. 4,789,425. This arrangement is used because if the ink supply is effected from the ink ejection pressure generation element formation side (ink ejection outlet formation surface), an ink supply member has to be located between the ink ejection outlet and the recording material such as paper or textile, and in such a case, the distance between the recording material and the ink ejection outlet cannot be reduced, because it is difficult to reduce the thickness of the ink supply member, with the result that the image quality is deteriorated because of the deterioration of the positional accuracy of the ink droplets that are shot.

A conventional example of a method for manufacturing side shooter type ink jet head will be described.

First, a silicon substrate having a through-opening constituting an ink supply port and an ink ejection pressure generation element for ejecting the ink is prepared. A dry film such as commercially available RISTON or VACREL (Dupont) is laminated on the silicon substrate, and the dry film is patterned so as to form an ink flow passage wall. An electro-formed plate having an ejection outlet is placed and bonded on the ink flow passage wall.

Here, in order to form the ejection outlet in the substrate having the through-opening, the ink flow passage wall is made of dry film. This is because if a method is used in which a resin material layer for the ink flow passage wall dissolved in a solvent is applied (solvent coating such as spin coating, roller coating), the resin material flows into the through-opening, the result being that the film formation is not uniform.

However, the use of the dry film involves the drawbacks, as follows.

For example, the film formation accuracy is poorer than in the film formation technique of spin coating or the like.

The above-described photo-polymerization dry film has poor coating property, so that formation of thin film more than 15 μm thick is difficult.

Generally, high resolution and high aspect ratios are difficult to provide.

Stability against time elapse is poor (property of transfer to the substrate or the patterning property).

The dry film sags into the through-opening.

With the recent development of the recording technique, a high precision image quality is demanded in the ink jet technique. Here, Japanese Laid Open Patent Applications Nos. HEI-4-10941 and 10942 proposes a system meeting this demand. More particularly, in this method, a driving signal is applied to the ink ejection pressure generation element (electrothermal transducer element) corresponding to recording information to generate thermal energy causing abrupt temperature rise beyond upper limit of nucleate boiling of the ink, by which a bubble is created in the ink to eject the ink droplet while permitting communication between the bubble and ambience. In the method, the volume and the speed of the small ink droplet are not influenced by the temperature and therefore are stabilized, so that a high quality image can be provided.

The inventors have proposed, as a manufacturing method suitable for producing ink jet heads of the ejection type, the following method.

In the first step, ink flow paths are formed with soluble resin material on the base having an ink supply port and ink ejection pressure generation elements.

Then, a coating resin material layer is formed on the soluble resin material layer.

Then, ink ejection outlets are formed on the coating resin material layer by light projection or oxygen plasma etching.

Then, the soluble resin material layer is dissolved out.

With the method, the positional accuracy between the ink ejection pressure generation element and ink ejection outlet is very high, but for the formation of the soluble resin material layer, the dry film has to be used, and therefore, the above-described drawbacks of the dry film still apply. Since this method provides the ink ejection outlets in the coating resin material layer the distance between the ink ejection outlets and the ink ejection pressure generation elements, which is one of important factors for the ink ejection accuracy, is influenced by the film formation accuracy of the soluble resin material layer.

Further, as disclosed in Japanese Laid Open Patent Application No. HEI-5-131628, the distance accuracy between the ink supply port and the ink ejection pressure generation element is significantly influenced by the operation frequency characteristics of the ink jet head, and therefore, the high positional accuracy formation technique for the ink supply port is determined.

SUMMARY OF THE INVENTION

Accordingly, it is a principal object of the present invention to provide a manufacturing method for an ink jet head wherein the ejection outlet formation of the side shooter type ink jet head is carried out on a flat substrate, thus permitting manufacturing of inexpensive and high precision ink jet head.

According to an aspect of the present invention there is provided a manufacturing method for an ink jet head having an ink ejection pressure generation element for generating energy for ejecting ink, and an ink supply port for supplying the ink to an ink jet head, comprising the steps of: preparing a silicon substrate; forming, on a surface of the silicon substrate, the ink ejection pressure generation element and silicon oxide film or silicon nitride film; forming anti-etching mask for forming an ink supply port on a back side of the silicon substrate; removing silicon on the back side of the silicon substrate at a position corresponding to the ink supply port portion through anisotropic etching; forming an ink ejection portion on a surface of the silicon substrate; removing the silicon oxide film or silicon nitride film from the surface of the silicon substrate of the ink supply port portion.

According to the manufacturing method of the ink jet head according to the present invention, the distance between the ejection energy generating element and the orifice can easily be made accurate, and the positional accuracies of the element and the center of the orifice can also easily be made accurate.

According to the present invention, the formation of the ink ejection outlets is possible on the flat surface substrate, and therefore, the film formation accuracy is high, and the selectable range of the member forming the ink ejection outlet portions can be widened.

Further, in the present invention, the positional accuracy of the present invention can be enhanced, and the distance between the ejection outlets and the ink ejection pressure generation elements can be decreased, and therefore, an ink jet head having a high operation frequency can be easily manufactured.

These and other objects, features and advantages of the present invention will become more apparent upon a consideration of the following description of the preferred embodiments of the present invention taken in conjunction with the accompanying drawings.

DESCRIPTION OF PREFERRED EMBODIMENTS

Referring to the accompanying drawings, the embodiments of the present invention will be described.

FIG. 1 to FIG. 10 are schematic views showing a fundamental example of the present invention, and show an example of manufacturing step of the method according to an embodiment of the present invention, and also show the structure of an ink let head.

Figure 1:
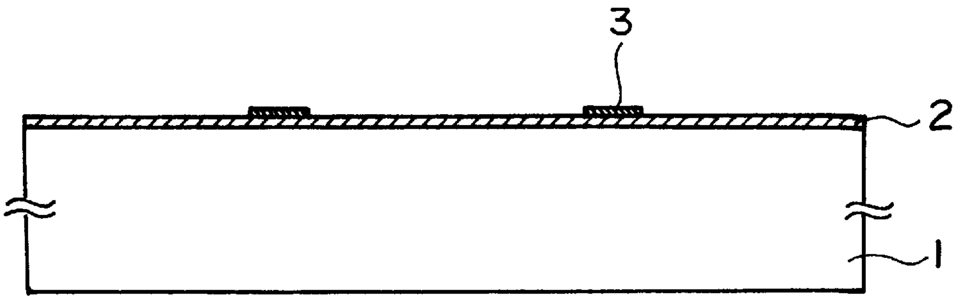
FIG. 1 is a schematic view showing a formation process for an ink supply port by silicon anisotropic etching.

In this example, as shown in FIG. 1, for instance, a desired number of ink ejection pressure generation elements 3 such as electrothermal transducer elements or piezoelectric elements are placed above a silicon substrate 1 (surface) having a crystal face direction <100> or <110> with silicon oxide or silicon nitride layer 2 therebetween. The silicon oxide or silicon nitride layer functions as a stop layer against anisotropic etching which will be described hereinafter. The ink ejection energy generating element 3 functions to eject a recording liquid droplet by applying ejection energy to the ink liquid. When energy is applied using an electrothermal transducer element as the ink ejection energy generating element 3, for example, the ejection energy is generated by heating the recording liquid adjacent the element. In this case, the silicon oxide or silicon nitride may function also as a heat accumulation layer. When energy is applied using a piezoelectric element, the ejection energy is generated by the mechanical vibration of the element An electrode (not shown) is connected to such an element 3 to supply it with control signals for driving the element. For the purpose of improving the durability of the ejection energy generating element, various function layers such as protection layer are usable, as is known.

Here, the protection layer may be the silicon oxide or silicon nitride layer 2 which is a stop layer against the anisotropic etching (FIG. 1).

Figure 2:
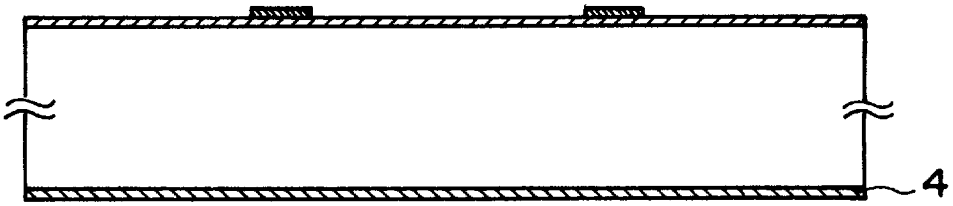
FIG. 2 is a schematic view showing a formation process for an ink supply port by silicon anisotropic etching.

Referring to FIG. 2, a member 4 functioning as a mask for forming an ink supply port is placed on such a surface (back surface) of the substrate 1 which does not have the ink ejection pressure generation element. The member 4 functions as a mask against the anisotropic etching of the silicon, and is preferably made of silicon oxide film or silicon nitride film. Here, the member 4 may be placed on the surface of the substrate if desired, and may be used also as the above-described protection layer.

Figure 3:
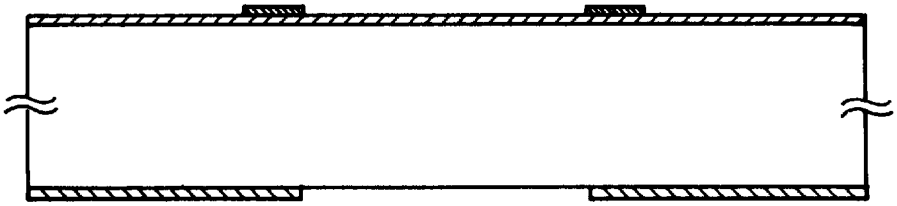
FIG. 3 is a schematic view showing a formation process for an ink supply port by anisotropic etching of silicon.

The portion of the member 4 which is going to be the ink supply port is removed by dry etching using $CF_4$ gas with the aid a normal photo-resist mask. Here, by using a means such a double-sided mask aligner, the position of the ink supply port is correctly determined relative to the ink ejection pressure generation element on the surface (FIG. 3).

Figure 4:
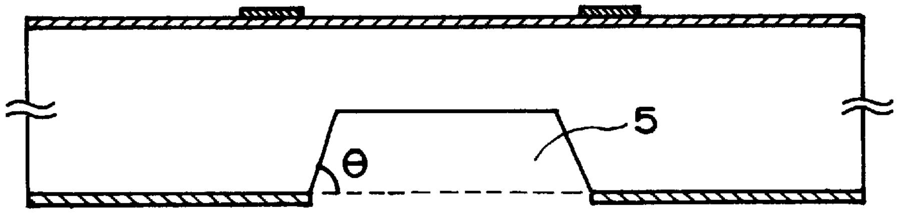
FIG. 4 is a schematic view showing a formation process for an ink supply port by anisotropic etching of silicon.

Subsequently, the substrate 1 is dipped in silicon anisotropic etching liquid, a typical example of which is strong alkali liquid, to form an ink supply port 5 (FIG. 4). The substrate surface is protected if desired. In the anisotropic etching for the silicon, the difference in the solubilities to the alkaline etching liquid depending on the crystal orientation, is used, and the etching stops at the <111> surface which has substantially no solubility. Therefore, the configuration of the ink supply port is different depending on the surface direction of the substrate 1. When the surface direction <100> is used, angle θ in FIG. 4 is 54.790°, and when the surface direction <110> is used, θ is 90° (perpendicular relative to surface) (in FIG. 4, surface direction <100> is used).

Since the silicon oxide and silicon nitride layer 2 has a resistance against the alkaline etching liquid, etching stops here. Therefore, there is no need to correctly detect the end point of the etching.

Here, the silicon oxide film and the silicon nitride film 2 are in the form of thin films at the time of the anisotropic etching completion, and therefore, the stress control in the film may be effected, depending on the form of the ink supply port, to avoid waving or crease, in some cases.

As for a method for the stress control of the film 2, the film 2 is made to be a multi-layer film containing at least one tensile stress layer involving a tensile stress. An example of the tensile stress is a silicon nitride film produced by a low pressure vapor phase synthesizing method.

Subsequently, a formation process for the nozzle portion in the substrate 1 is carried out. Here, the description will be made as to a manufacturing method using the above-described soluble resin material layer. The substrate 1 is covered with the silicon oxide or silicon nitride film 2 even on the ink supply port, and therefore, the surface is so flat that spin coating means, roller coating means or another applying means, is can be used.

If the film thickness is not more than 50 $\mu$m, a high accuracy film can be formed for any film thickness.

A material which is unable to be formed as dry film, for example, a material having a poor coating property, is also usable.

Figure 6:
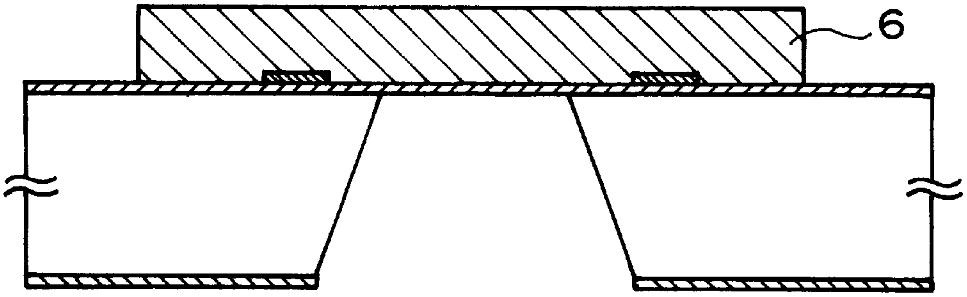
FIG. 6 is a schematic view showing a formation process of an ink ejection outlet.

A soluble resin material layer is formed as a film on the substrate 1 through the spin coating method or roller coating method, and thereafter, a patterning is effected to form an ink passage pattern 6 through a photolithography method (FIG. 6).

Figure 7:
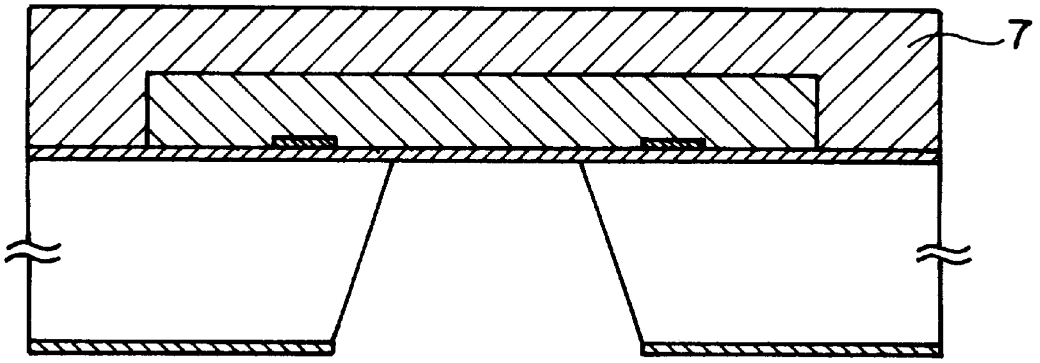
FIG. 7 is a schematic view showing a formation process of an ink ejection outlet.

Then, a coating resin material layer 7 is formed as shown in FIG. 7. Since the resin material functions as structure material for the ink jet head, it has high mechanical strength, heat-resistivity, adhesiveness relative to the substrate, resistance against the ink liquid and the property of not altering the nature of the ink liquid.

The coating resin material layer 7 preferably is polymerized and cured by light or thermal energy application thereto, and is strongly and closely contacted to the substrate.

Such a coating resin material layer 7 forms ink flow passage walls by being provided so as to cover the ink flow path pattern 6.

Figure 8:
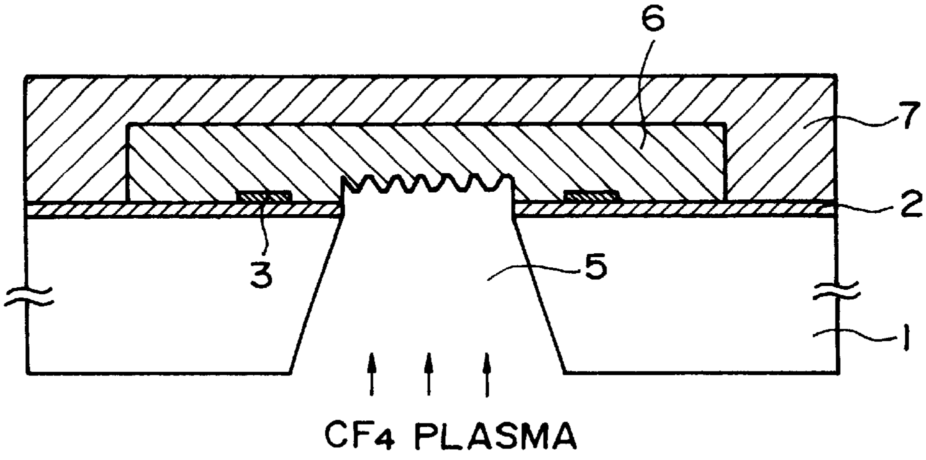
FIG. 8 is a schematic view showing a formation process of an ink ejection outlet.

After the curing of the coating resin material layer 7, the plasma dry etching is effected from the back side of the silicon substrate 1 with $CF_4$ or the like, so that the silicon oxide or silicon nitride film 2 on the ink supply port 5 is removed to provide a through opening for the ink supply port. Here, the etching end of the silicon oxide or silicon nitride film 2 needs not be correctly detected, but the end portion may be deemed by any point in the ink flow path pattern 6 formed with the soluble resin material layer (FIG. 8). The removal of the silicon nitride film 2 or the silicon oxide from the ink supply port 5 may be effected after the ink ejection outlet formation which will be described hereinafter, although it is preferable to carry it out before removal of the ink flow path pattern 6.

Figure 9:
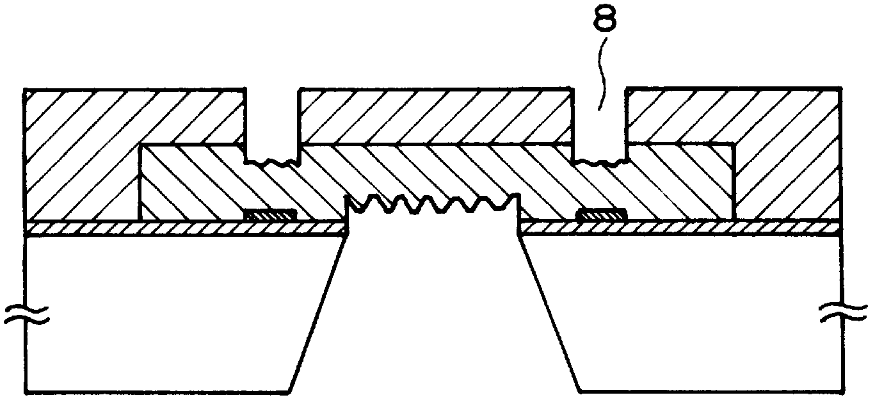
FIG. 9 is a schematic view showing a formation process of an ink ejection outlet.

Then, the ink ejection outlet 8 is formed on the coating resin material layer 7 (FIG. 9). As for the forming method of ink ejection outlet, photolithography is usable for the patterning therefor, when the coating resin material layer 7 has a photosensitive property. In the case of processing the cured resin material layer, usable methods include a method using an eximer laser and a method using oxygen plasma, for example.

Figure 10:
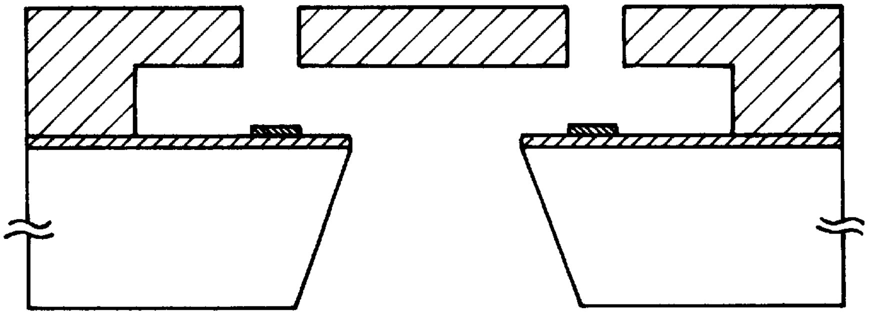
FIG. 10 is a schematic view showing a formation process of an ink ejection outlet.

As shown in FIG. 10, the soluble resin material layer 6 forming the ink flow path pattern is dissolved out. To the substrate now having the ink flow paths and ink ejection outlets formed in this manner, a member for ink supply and electric connection for driving the ink ejection pressure generation element, are mounted, so that the ink jet head is manufactured.

In the preparation process for the ink jet head, the order of the steps is anisotropic etching, nozzle formation and anisotropic etching stop layer removal. But, the order may be nozzle formation, anithotropic etching and anisotropic etching stop layer removal process. More particularly, the mask member 4 is formed on the back side of the substrate 1, (FIG. 2 or FIG. 3), and the nozzle portions are formed, and thereafter, the anisotropic etching process is carried out. In this case, however, it should be noted that most of the materials for the nozzle formation member do not have enough resistance against the anisotropic etching liquid, and therefore, proper protection is preferably made against the circumvention of the anisotropic etching liquid to the front surface of the substrate already having the formed nozzles.

(Embodiment 1)

In this embodiment, the ink jet head was manufactured through the processes showed in FIG. 1–FIG. 10. Silicon oxide films are formed on both surfaces of the silicon wafer having a crystal face direction <100> and having a thickness of 500 $\mu$m through heat oxidation (thickness is 2.75 microns). Then, electrothermal transducer elements serving as the ejection energy generating elements and electrodes for control signal input for operating the elements, are formed on the silicon oxide film (the surface having the electrothermal transducer element is called the front surface or surface, hereinafter).

Here, the back side of the silicon wafer is provided with a silicon oxide film formed through the heat oxidation, and therefore, there is no need of additional mask member for the anisotropic etching of the silicon. The silicon oxide film on the back side is removed through plasma etching by the $CF_4$ gas only at the portion corresponding to the ink supply port (FIG. 3).

Subsequently, the silicon wafer is dipped at 110° C. for 2 hours in 30% potassium hydroxide aqueous solution, thus effecting the anisotropic etching for the silicon. Here, on the front surface of the wafer, a rubber type resist is placed as a protecting film, and contact of the potassium hydroxide aqueous solution is prevented. Since the anisotropic etching is stopped by the silicon oxide film on the surface of the silicon wafer, it is not necessary to correctly control the duration, temperature of the etching operation.

The silicon wafer having been subjected to the anisotropic etching, is now subjected to pure water cleaning and removal of the rubber type resist, and is put into the nozzle portion formation process.

First, PMER A-900 (available from Tokyo Ouka Kogyo KABUSHIKI KAISHA) as a soluble resin material, is applied through spin coating method, and the patterning and development are carried out using mask aligner MPA-600 available from Canon Kabushiki Kaisha to form the mold of the ink flow paths (FIG. 6). The PMER is known as novolak type resist having high re solution image property and stabilized patterning property, but having a poor coating property and therefore not suitable for formation into dry film. Here, in the present invention, the front surface of the silicon wafer is flat, and therefore, the resist of the novolak type can be applied with correct thickness through the spin coating method.

Then, the coating resin material layer for forming the nozzles and ink ejection outlets, is formed through the spin coating method, on the soluble resin material layer which is going to be the member for constituting the ink flow path. The coating resin material layer becomes a structure material of the ink jet head, and therefore, high mechanical strength, high adhesiveness relative to the substrate, high ink-resistant or the like is desired, and cation polymerization cured material produced from the epoxy resin material by heat and light reaction, is most preferably used. In this embodiment, the use was made with EHPE-3150, available from Daicell Kagaku Kogyo KABUSHIKI KAISHA, Japan, which is an alicyclic type epoxy resin material, as the epoxy resin material, and with a mixed catalyst comprising 4,4-di-t-butyl-diphenyliodoniumhexafluoroantimonate/copper triflate, as thermosetting cation polymerization catalyst.

For penetration of the ink supply port, the silicon oxide film is removed from the ink supply port. The silicon oxide film can be removed at the back side of the silicon wafer through the plasma etching using the $CF_4$ gas. Here, on the ink supply port, the soluble resin material layer to be removed in a later step is filled, and therefore, plasma etching may be stopped at any point in the soluble resin material, so that the coating resin material layer is not influenced by the plasma etching. Wet etching is available for the silicon oxide film by dipping in hydrofluoric acid.

Subsequently, the ink ejection outlets are formed on the coating resin material layer. In this embodiment, the ejection outlets are formed through oxygen plasma etching.

Figure 11:
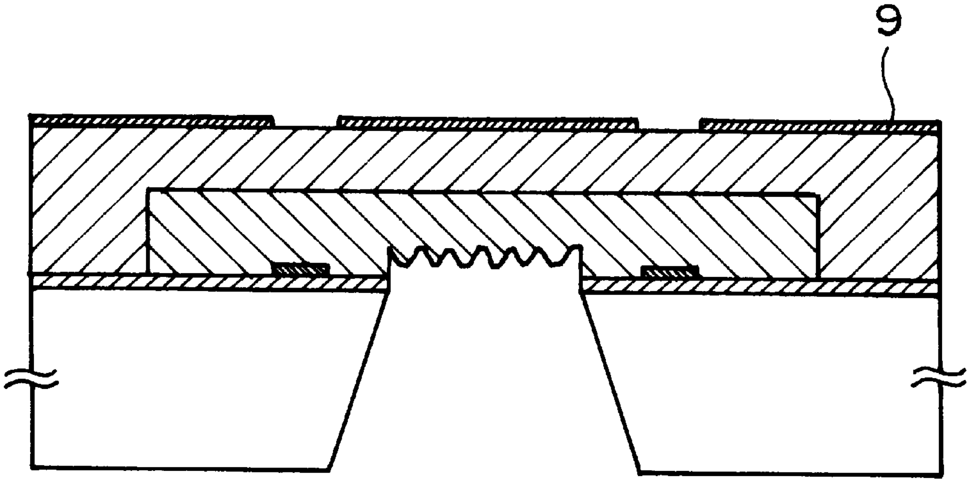
FIG. 11 is a schematic view of a formation process for an ink ejection outlet using oxygen plasma etching.
Figure 12:
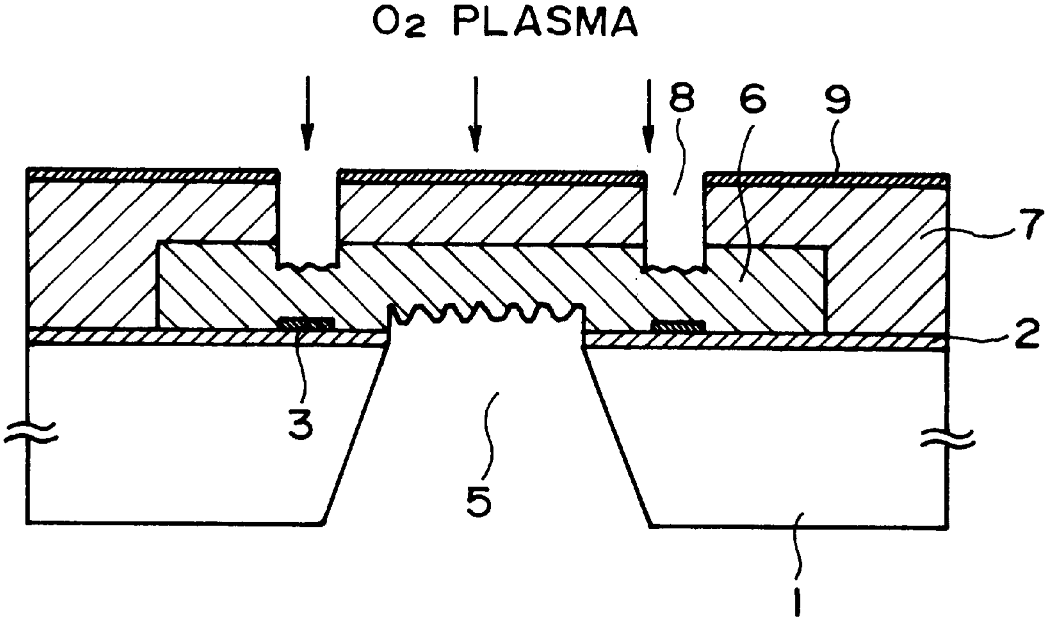
FIG. 12 is a schematic view of a formation process for an ink ejection outlet using oxygen plasma etching.

On the coating resin material layer of the silicon wafer from which the silicon oxide film has been removed at the ink supply port, silicon containing positive-type resist FH-SP 9, available from Fuji HANT KABUSHIKI KAISHA, is applied, to effect patterning for the portions (not shown) for the ink supply port and for the electric connection for the signal input (FIG. 11). Then, the ejection outlet portions and electric connecting portions (not shown) are etched by oxygen plasma etching, wherein the resist FH-SP functions as ti-oxygen-plasma film. The etching is stopped at any point in the soluble resin material layer only at the ejection outlet portion. By doing so, the heater surface is not damaged.

In this embodiment, the ejection outlets are formed through the oxygen plasma etching, but in another example, they are formed by abrasion by projection of eximer laser through a mask.

Subsequently, the soluble resin material layer and the FH-SP film are removed (FIG. 10).

Finally, an ink supply member, is connected, and electrical connection for the signal input is connected, thus accomplishing the ink jet head.

The ink jet head was manufactured in this manner, was mounted to a recording device, and recording operations were carried out using ink comprising pure water/diethylene glycol/isopropyl alcohol/lithium acetate/black color dye hoodblack 2=79.4/15/3/0.1/2.5. Stable printing was possible, and the resultant print had high quality. With the ink jet recording head of this embodiment, as has been described hereinbefore, all of the ink ahead of the heater is ejected out. Therefore, if the nozzle structure is correct without variation (particularly, nozzle height=soluble resin material layer+coating resin material layer), it is expected that the variation of the ejection amounts among the nozzles, is very small. The variation was measured using the ink jet head according to this embodiment. The variation of the ejection amounts was measured, as follows. The printing is carried out with a specified pattern by ejection the ink by each nozzle on a recording material (coating paper), and the average and the standard deviation (number of samples 10) of the optical density (O.D.) are determined. The results are shown in Table 1.

TABLE 1

| | O.D. Ave. | Standard deviation σ |
|---|---|---|
| Pattern 1 | 0.72 | 0.01 |
| Pattern 2 | 1.45 | 0.01 |

As will be understood from Table 1, there is hardly any variation in the ejection amounts among the nozzles, according to this embodiment, and therefore, the image quality was high.

(Embodiment 2)

In this embodiment, the ink jet head was prepared through nozzle process, anisotropic etching, and anisotropic etching stop layer removal process, in the order named.

On the surface of the silicon wafer 1 having a thickness of 500 μm and having crystal face direction <100>, electrothermal transducer elements 3 as the ejection energy generating elements and a driving circuit for operating the elements, were formed. Then, a silicon nitride film 2 was formed on the surface of the silicon wafer as a stop layer against the anisotropic etching. The silicon nitride film 2 functions also as a protecting film for the electrothermal transducer elements. Then, a silicon nitride film was formed on the back side of the wafer as a mask member 4 against the anisotropic etching (FIG. 2).

Subsequently, in this embodiment, nozzle portions are formed. Similarly to Embodiment 1, the ink flow path molds were formed using PMER as the soluble resin material layer, and the coating resin material layer was formed. As for the coating resin material layer, a similar composition as in the Embodiment 1 was used. Here, the mixed catalyst comprising 4,4-di-t-butyldiphenyliodoniumhexafluoroantimonate/copper triflate has photosensitive property, and therefore, the ink ejection outlets were formed through photolithography. After coating resin material layer formation, it is exposed through a mask 12 using a mask aligner PLA 520 (coldmirror 250, available from CANON) (FIG. 3), and the development was carried out to formation the ink ejection outlets.

Subsequently, the wafer was dipped for 15 time at 80° C. in 22 TMAH (tetramethylammoniumhydroxide) aqueous solution to anisotropic etching for the silicon.

At this time, the TMAH aqueous solution was structurally prevented from contacting to the wafer surface having the formed nozzle portions. After the anisotropic etching completion, the silicon nitride film below the ink supply port and the soluble resin material layer were removed so that the ink jet head was accomplished.

Finally, similarly to Embodiment 1, the electrical connection for the signal input and ink supply member mounting were carried out, and good printing was confirmed.

(Embodiment 3)

In this embodiment, the use was made with the method disclosed in Japanese Laid Open Patent Application No. SHO-62-264957 Specification, for this invention.

Figure 5:
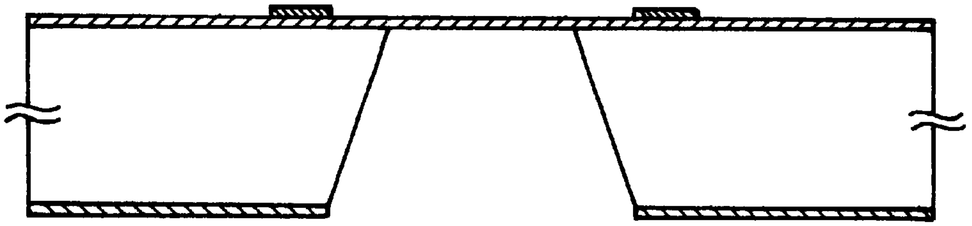
FIG. 5 is a schematic view showing a formation process for an ink supply port by anisotropic etching of silicon.

Up to the stage of formation of the ink supply port by anisotropic etching of silicon, the steps are substantially the same as in Embodiment 1 (FIG. 5).

Figure 13:
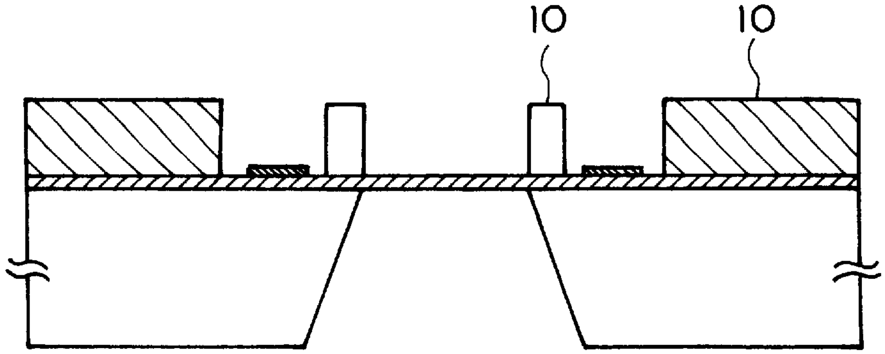
FIG. 13 is a schematic view of a process for forming an ink ejection outlet by laminating a member having an ink ejection outlet.

Then, the resin material layer 10 for constituting the nozzle, was formed by spin coating, and the patterning using light projection, and development were carried out (FIG. 13).

Here, since the surface of the silicon wafer is flat, the spin coating is usable for the film formation. This is advantageous as follows.

The film formation is possible with high accuracy with any given film thickness even to such an extent of not more than 15 μm which is difficult with the use of dry film, so that the design latitude was increased.

Since the ink does not fall into the ink supply port as contrasted to the case of use of the dry film, ink supply port may be disposed closer to upper nozzle portions (improvement of the operation frequency of the ink jet head).

A material which is not easily formed into a dry film (a material having poor coating property), is usable.

In this embodiment, the following composition (Table 2) was used as the nozzle structure material.

TABLE 2

| | | wt. parts |
|---|---|---|
| Epoxy resin | Ortho-cresolnovolak epoxy resin Epicote 180H65 (mfd. by Yuka Shell Epoxy) | 80 |
| | Propyreneglycol modified bisphenol A epoxy resin | 15 |
| Silane coupling agent | A-187 (mfd. by Nippon Uniker) | 3 |
| Photocation polymerization initiator | SP-170 (mfd. by Asahi Denka Kogyo) | 2 |

The composition of representation 2 is excellent in the anti-ink property, but the coating property is poor, and therefore, it could be applied with controlled thickness on a silicon wafer by using the spin coating.

Figure 14:
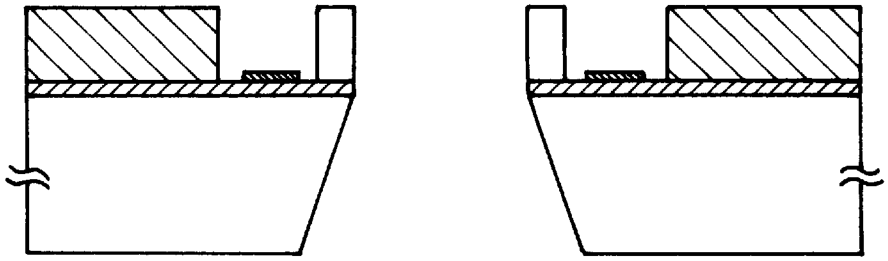
FIG. 14 is a schematic view of a process for forming an ink ejection outlet by laminating a member having an ink ejection outlet.
Figure 15:
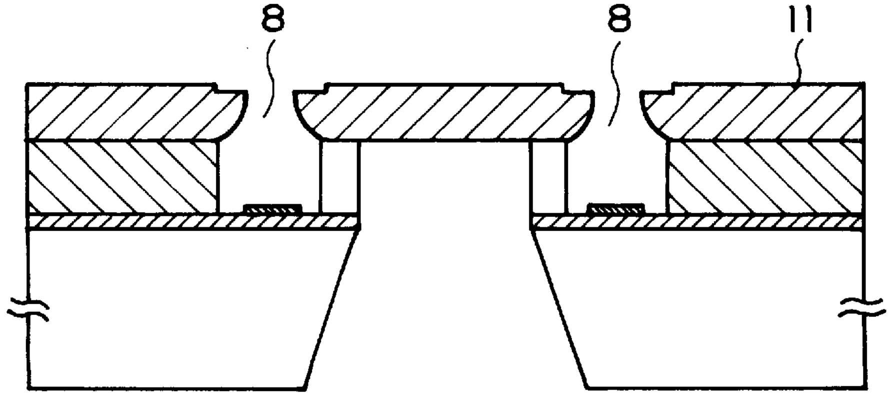
FIG. 15 is a schematic view of a process for forming an ink ejection outlet by laminating a member having an ink ejection outlet.

Similarly to Embodiment 1, the silicon oxide on the ink supply port is removed (FIG. 14). Then, a member 11 having ink ejection outlets 8 prepared through electro-forming of nickel, was positioned and heat-crimped on the nozzle structure material 10, so that an ink jet head was manufactured (FIG. 15). Finally, the mounting of the ink supply member and the electrical connection for the signal input were carried out. Print evaluation was carried out, and it has been confirmed that good printing operation was accomplished.

While the invention has been described with reference to the structures disclosed herein, it is not confined to the details set forth and this application is intended to cover such modifications or changes as may come within the purposes of the improvements or the scope of the following claims.

What is claimed is:

1. A manufacturing method for an ink let head having an ink election pressure generation element for generating energy for electing ink, and an ink supply port for supplying the ink to an ink jet head, comprising the steps of:

preparing a silicon substrate;

forming, on a surface of the silicon substrate, the ink ejection pressure generation element and silicon oxide film or silicon nitride film;

forming anti-etching mask for forming an ink supply port on a back side of the silicon substrate;

removing silicon on the back side of the silicon substrate at a position corresponding to the ink supply port portion through anisotropic etching;

forming an ink election portion on a surface of the silicon substrate by the steps of forming an ink flow path with a soluble resin material, forming a coating resin material layer on the soluble resin material layer, and forming the ink ejection outlet on the coating resin material layer; and removing the silicon oxide film or silicon nitride film from the surface of the silicon substrate of the ink supply port portion.

2. A method according to claim 1, wherein the soluble resin material layer is applied on said silicon substrate through spin coating or roller coating.

3. A method according to claim 1, wherein said ink ejection portion forming process is carried out after said anisotropic etching process.

4. A method according to claim 1, wherein said anisotropic etching process is carried out after the ink ejection portion forming process.

5. A manufacturing method for an ink jet head having an ink ejection pressure generation element for generating energy for ejecting ink, and an ink supply port for supplying the ink to an ink jet head, comprising the steps of:

preparing a silicon substrate:

forming, on a surface of the silicon substrate, the ink ejection pressure generation element and silicon oxide film or silicon nitride film;

forming anti-etching mask for forming an ink supply port on a back side of the silicon substrate;

removing silicon on the back side of the silicon substrate at a position corresponding to the ink supply port portion through anisotropic etching;

forming an ink election portion on a surface of the silicon substrate by forming the ink flow path with a photo-curable resin material and laminating a member having the ink ejection outlet on the photo-curable resin material having the ink flow path;

removing the silicon oxide film or silicon nitride film from the surface of the silicon substrate of the ink supply port portion.

6. A method according to claim 5, wherein the soluble resin material layer is applied on the silicon substrate through spin coating or roller coating.

7. A method according to claim 5, wherein said ink ejection portion forming process is carried out after said anisotropic etching process.

8. A method according to claim 5, wherein said anisotropic etching process is carried out after the ink ejection portion forming process.

9. A manufacturing method for an ink jet head having an ink ejection pressure generation element for generating energy for ejecting ink, and an ink supply port for supplying the ink to an ink jet head, comprising the steps of:

preparing a silicon substrate;

forming, on a surface of the silicon substrate, the ink ejection pressure generation element and silicon oxide film or silicon nitride film;

forming anti-etching mask for forming an ink supply port on a back side of the silicon substrate;

removing silicon on the back side of the silicon substrate at a position corresponding to the ink supply port portion through anisotropic etching;

forming an ink flow path pattern with a soluble resin material on the surface of the silicon substrate;

forming a coating resin material layer on the ink flow path pattern;

curing the coating resin material layer;

forming the ink ejection outlet in the coating resin material layer;

removing the silicon oxide film or silicon nitride film from the surface of the silicon substrate of the ink supply port portion to form the ink supply port;

forming the ink flow path in fluid communication with the ink ejection outlet and ink supply port by dissolution removal of the ink flow path pattern from the silicon substrate having the ink supply port and ink ejection outlet.

10. A method according to claim 9, wherein the silicon substrate has a crystal face direction of <100> surface.

11. A method according to claim 9, wherein the silicon substrate has a crystal face direction of <110> surface.

12. A method according to claim 9, wherein said anti-etching mask is of silicon oxide film or silicon nitride film.

13. A method according to claim 9, wherein the soluble resin material layer is applied on said silicon substrate through spin coating or roller coating.

14. A method according to claim 9, wherein the silicon oxide film or silicon nitride film on the surface of the silicon substrate comprises a plurality of films including at least one of tensile stress film involving tensile stress.

15. A method according to claim 14, wherein said at least one film is produced by low pressure vapor phase synthesizing method.

16. A method according to claim 9, wherein said ink ejection portion forming process is carried out after said anisotropic etching process.

17. A method according to claim 9, wherein said anisotropic etching process is carried out after the ink ejection portion forming process.

18. A manufacturing method for an ink jet head having an ink ejection pressure generation element for generating energy for ejecting an ink, and an ink supply port for supplying the ink to an ink jet head, comprising the steps of:

preparing a silicon substrate;

forming, on a surface of the silicon substrate, the ink ejection pressure generation element and a one of a silicon oxide film and a silicon nitride film;

forming an anti-etching mask for forming an ink supply port a back side of the silicon substrate;

forming an ink flow path pattern with a soluble resin material on the surface of the silicon substrate;

forming a coating resin material layer on the ink flow path pattern;

forming the ink jet ejection outlet in the coating resin material layer;

removing silicon on the back side of the silicon substrate at a posite corresponding to the ink supply port portion through anisotropic etchin which is performed with the coating resin material existing on the ink flow path pattern;

removing the silicon oxide film or the silicon nitride film from the surface of the silicon substrate of the ink supply port portion to form the ink supply port; and forming the ink flow path in fluid communication with the ink ejection outlet and the ink supply port by dissolution removal of the ink flow path pattern from the silicon substrate having the ink supply port and ink ejection outlet.

* * * * *

UNITED STATES PATENT AND TRADEMARK OFFICE
CERTIFICATE OF CORRECTION

PATENT NO. : 6,139,761
DATED : October 31, 2000
INVENTOR(S) : Norio Ohkuma

It is certified that error appears in the above-identified patent and that said Letters Patent is hereby corrected as shown below:

Column 4,
Line 20, "element" should read -- element. -- ; and
Line 67, "waving or crease," should read -- forming waves or creases, --.

Column 5,
Line 59, "eximer" should read -- excimer --.

Column 6,
Line 53, "re solution" should read -- resolution --.

Column 7,
Line 39, "eximer" should read -- excimer --.

Column 8,
Line 38, "formation" should read -- form -- .

Column 9,
Line 46, "let" should read -- jet --; and
Line 48, "electing" should read -- ejecting --.

Column 10,
Line 23, "election" should read -- ejection --.

UNITED STATES PATENT AND TRADEMARK OFFICE
CERTIFICATE OF CORRECTION

PATENT NO. : 6,139,761
DATED : October 31, 2000
INVENTOR(S) : Norio Ohkuma

It is certified that error appears in the above-identified patent and that said Letters Patent is hereby corrected as shown below:

Column 12,
Line 6, "port" should read -- port on --;
Line 15, "posite" should read -- position --; and
Line 16, "etchin" should read -- etching --.

Signed and Sealed this

Thirteenth Day of November, 2001

*Attest:*

Nicholas P. Godici

NICHOLAS P. GODICI

*Attesting Officer*

*Acting Director of the United States Patent and Trademark Office*